United States Patent
Chen

(10) Patent No.: US 7,972,025 B2
(45) Date of Patent: Jul. 5, 2011

(54) LIGHT EMITTING DIODE DEVICE

(75) Inventor: Ga-Lane Chen, Santa Clara, CA (US)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 190 days.

(21) Appl. No.: 12/327,572

(22) Filed: Dec. 3, 2008

(65) Prior Publication Data
US 2009/0262523 A1 Oct. 22, 2009

(30) Foreign Application Priority Data

Apr. 16, 2008 (CN) .......................... 2008 1 0301150

(51) Int. Cl.
*F21L 4/00* (2006.01)

(52) U.S. Cl. .......................... 362/183; 362/800; 362/192
(58) Field of Classification Search .................. 362/183, 362/192, 800, 249.01, 240; 320/112–115; 315/210; 136/255
See application file for complete search history.

(56) References Cited

U.S. PATENT DOCUMENTS

| | | | |
|---|---|---|---|
| 5,656,098 A * | 8/1997 | Ishikawa et al. | 136/256 |
| 2007/0235071 A1 * | 10/2007 | Work et al. | 136/244 |

* cited by examiner

*Primary Examiner* — Evan Dzierzynski
(74) *Attorney, Agent, or Firm* — Clifford O. Chi

(57) ABSTRACT

A light emitting diode device includes a light emitting diode illumination element, a solar cell unit generating power for the illumination element and a rechargeable cell unit storing the power.

11 Claims, 2 Drawing Sheets

LIGHT EMITTING DIODE DEVICE

BACKGROUND OF THE INVENTION

1. Field of the Invention

The disclosure relates to a light emitting diode (LED) device, and particularly to a light emitting diode device providing its own power for illumination.

2. Description of Related Art

Nowadays, with the earth resources being depleted day by day, the cost of investment for energy increases significantly. For the sake of saving energy of the world and earth protection, energy efficiency is more and more emphasized, and has found widespread applications in a variety of fields. With an optical spectrum providing a chromatic diagram approaching natural sunlight, and high illumination efficiency, LEDs are gaining popularity in lighting devices such as streetlamps, standing lamps, industrial lighting, and many other applications. A scientific literature can be referred for related researches: "Solid State Lighting: Toward Superior Illumination", published on No. 10, Vol. 93, Proceeding of the IEEE, October of 2005. However, light emitting diode devices normally require power supply from an external source.

SUMMARY

Therefore, a light emitting diode device supplying its own power is required.

The disclosure provides a light emitting, including an illumination element comprising a plurality of light emitting diodes (LED), a solar cell unit generating electrical power, a rechargeable cell unit storing power that the solar cell unit generates, which is then provided to the illumination element. The light emitting diode device further comprises a recharging and discharging controller, which, in a charging mode manages charging of the rechargeable cell unit, and in a discharging mode controls the brightness of the illumination element.

DETAILED DESCRIPTION

A detailed description of the disclosure follows with reference to the accompanying drawings.

Figure 1:
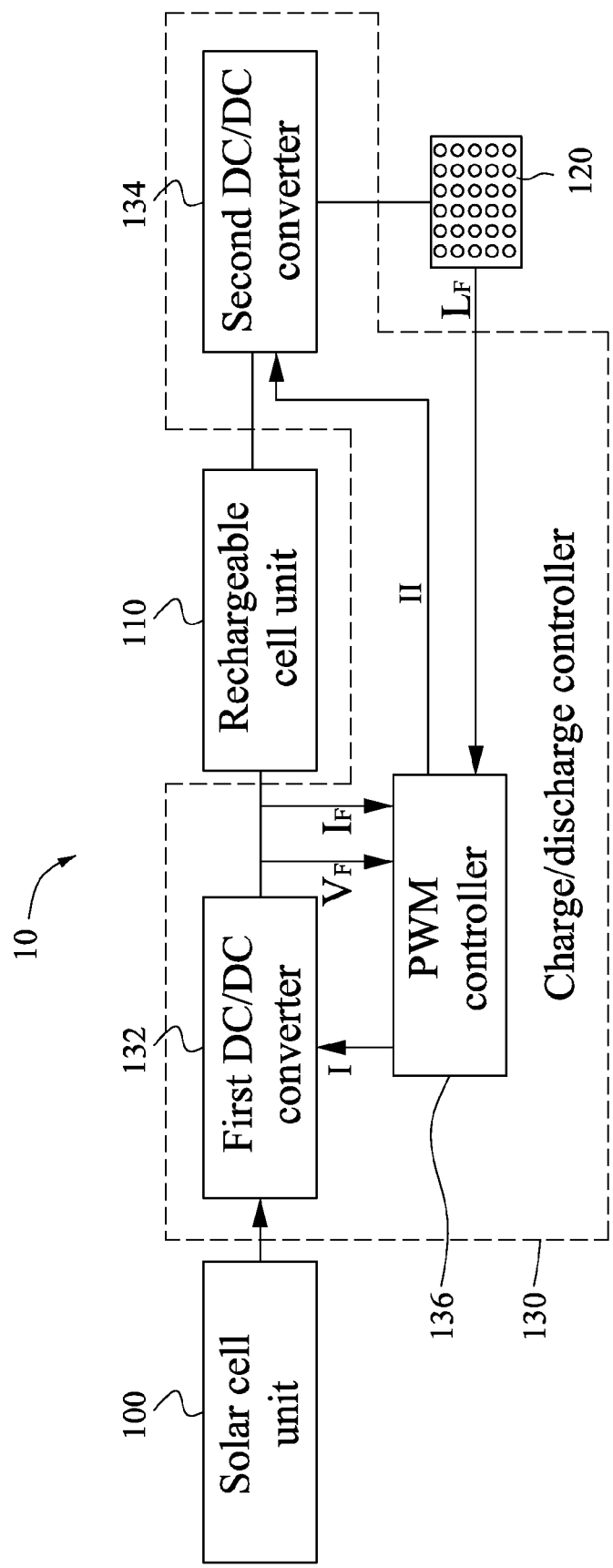
FIG. 1 is an illustration diagram showing a LED source device according to an embodiment of this disclosure.
Figure 2:
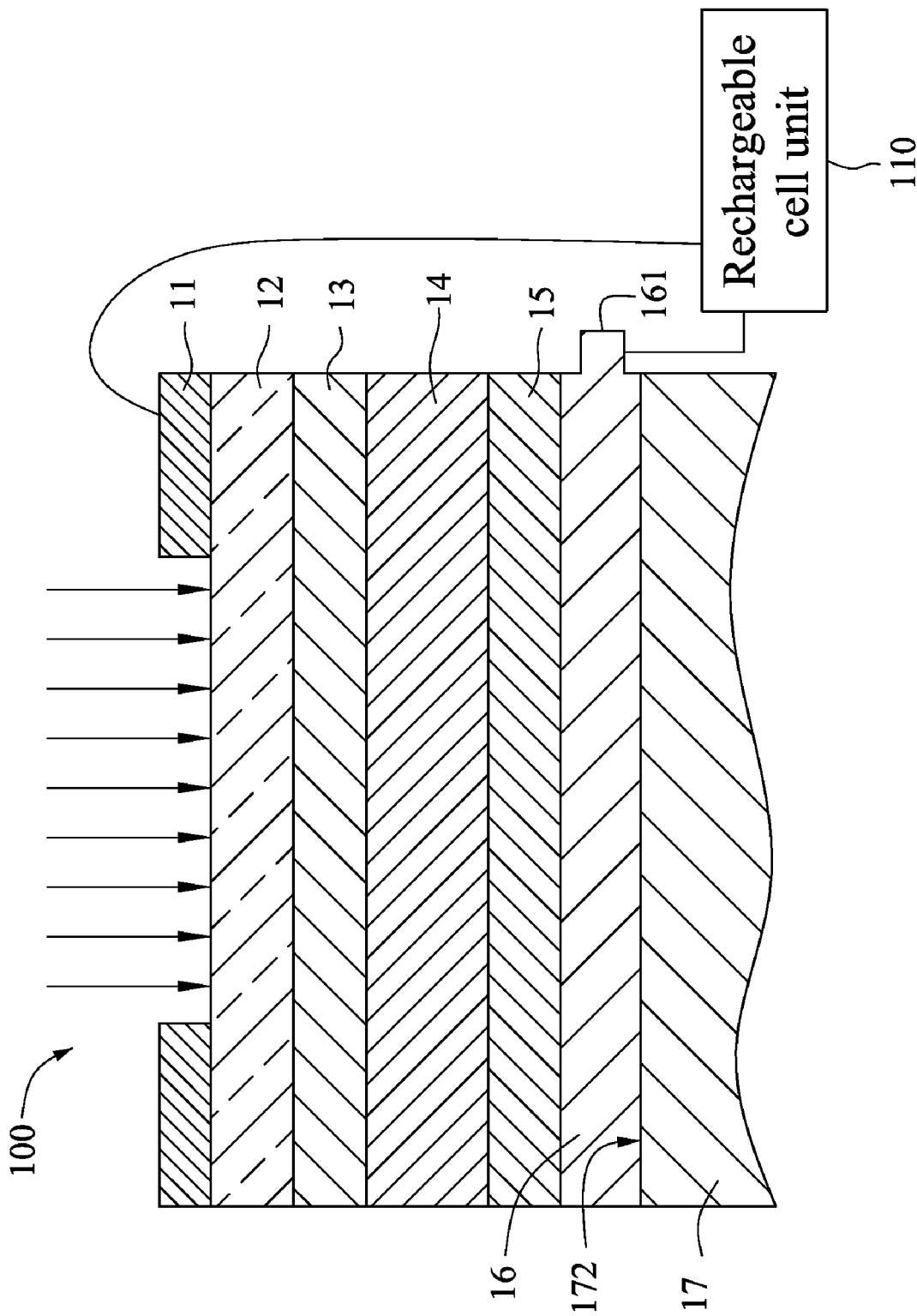
FIG. 2 is a cross sectional view showing a solar cell unit of a LED source device according to an embodiment of this disclosure.

FIG. 1 and FIG. 2 illustrate an exemplary LED light device 10 according to the disclosure, which comprises a solar cell unit 100, a rechargeable cell unit 110, and an LED illumination element 120.

The solar cell unit 100 comprises a substrate 17 having a loading surface 172. A rear metal layer 16, a P-type semiconductor layer 15, a P-N junction layer 14, an N-type semiconductor layer 13, a transparent conductive oxide layer 12, and a front metal layer 11 are sequentially formed on the loading surface 172.

The substrate 17 is flexible material, about 10 μm to 100 μm thick, such as aluminum magnesium alloy foil, aluminum stainless steel sheet, polymer sheet, single silicon, polysilicon or glass material, or others, with materials disclosed here only for illustration and not limitation.

The rear metal layer 16 can be silver, copper, molybdenum, aluminum, copper and aluminum alloy, silver and copper alloy, copper and molybdenum alloy or other. An electrical connect end 161 is provided on one side of the rear metal layer 16.

The P-type semiconductor layer 15 may be any amorphous silicon (P-a-Si) material, and particularly can be hydrogenous P-type amorphous silicon (P-a-Si:H). The P-type semiconductor layer may be III-V compound, particularly aluminum, gallium or doped semiconductor material, such as AlGaN or AlGaAs.

An exemplary material of the P-type semiconductor 15 is P-type amorphous silicon. Because the light absorbency of amorphous silicon is about 500 times that of crystal silicon, an amorphous silicon P-type semiconductor layer can be much thinner than a crystal silicon P-type semiconductor layer with the same requirement of light absorbency. Therefore, amorphous silicon material is more suitable for use in solar cells than crystal silicon.

The P-N junction layer 14 may be III-V compound or I-III-VI compound, such as cadium telluride (CdTe), or copper indium selenide (CuInSe2) for better connection. The P-N junction layer may also be copper indium gallium selenide (CuIn1-XgaSe2, CIGS). The P-N junction layer 14 transforms photons to electron-hole pairs and forms barrier potential.

The N-type semiconductor layer 13 may be N-type amorphous silicon (N-a-Si), particularly hydrogenous N-type amorphous silicon (N-a-Si:H). The N-type semiconductor layer 13 may also be made of III-V compound or II-VI compound, particularly N, P or doped semiconductor, such as GaN or InGaP.

The transparent conductive layer 12 may be made of, for example, Indium Tin Oxide (ITO), ZnO, or other.

The front metal layer 11 may be silver, copper, molybdenum, aluminum, copper aluminum alloy, silver copper alloy, or copper molybdenum alloy. The front metal layer 11 and the rear metal layer 16 of the solar cell unit 100 can be connected to the anode and cathode of the rechargeable battery 110 through an electrical connecting end 161 for charging.

The rechargeable battery 110 may be lithium ion/lithium polymer cells, providing power to LED illumination element 120 with a compact profile.

In this embodiment, the LED illumination element 120 includes a plurality of LED arrays, with the area of the solar cell unit 100 determined by the required photoelectrical transformation efficiency and power that the solar cell unit needs.

The LED light device 10 further comprises a module chip acting as a recharge/discharge controller 130, which comprises a first DC/DC converter 132, a second DC/DC converter 134, and a PWM (pulse width modulation) controller 136.

The solar cell unit 100 is electrically connected to a rechargeable cell unit 110 through the first DC/DC converter 132, and the rechargeable cell unit 110 is electrically connected to the LED illumination element 120 through the second DC/DC converter 134.

The PWM controller 136 is electrically connected to the rechargeable cell unit 110, the first DC/DC converter 132, the LED illumination element 120, and the second DC/DC converter 134.

In a charging mode, the PWM controller 136 receives a voltage feedback signal VF and a current feedback signal IF from the rechargeable battery unit 110, and provides a first PWM output signal (shown as "I" in FIG. 2) to the first DC/DC converter 132, precisely controlling the rechargeable battery unit 110.

In a discharging mode, the PWM controller 136 receives an illumination feedback signal LF, and provides a second PWM output signal (shown as "II" in FIG. 2) to the second DC/DC converter 134, precisely controlling the brightness of the LED illumination element 120. A duty cycle is predetermined by the second PWM output signal, which controls the ratio of a turn-on time and a turn-off time of the LED illumination element 120, thereby controlling the brightness thereof.

The LED light source further comprises a solar cell unit and a rechargeable cell unit providing power to the solar cell unit. The LED illumination element is thus powered by the rechargeable battery unit, with no requirement for an external power supply.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode device, comprising:
   an illumination element comprising a plurality of light emitting diodes (LEDs);
   a solar cell unit for generating power;
   a rechargeable cell unit electrically connected to the solar cell unit for storing power generated by the solar cell unit and providing the stored power to the illumination element;
   a first DC/DC converter electrically connected to the solar cell unit and the rechargeable cell unit;
   a second DC/DC converter electrically connected to the illumination element and the rechargeable element; and
   a pulse width modulation (PWM) controller, wherein the solar cell unit is electrically connected to the rechargeable cell unit through the first DC/DC converter, and the rechargeable cell unit is electrically connected to the illumination element through the second DC/DC converter;
   wherein in a charge mode, the PWM controller receives a first feedback signal from the rechargeable battery unit, and provides a first output signal to the first DC/DC converter; and
   wherein in a discharge mode, the PWM controller receives a second feedback signal from the rechargeable battery unit, and provides a second output signal to the second DC/DC converter for controlling the brightness of the illumination element.

2. The light emitting diode device as claimed in claim 1, wherein the solar cell unit comprises a substrate, a rear metal layer, a P-type semiconductor layer, a P-N junction layer, an N-type semiconductor layer, a transparent conductive layer, and a front metal layer.

3. The light emitting diode device as claimed in claim 2, wherein the substrate comprises a loading surface with the rear metal layer provided thereon, the P-type semiconductor layer provided on the rear metal layer, the P-N junction layer provided on the P-type semiconductor layer, the N-type semiconductor layer provided on the P-N junction layer, and the transparent conductive layer provided on the N-type semiconductor layer.

4. The light emitting diode device as claimed in claim 2, wherein the substrate is flexible.

5. The light emitting diode device as claimed in claim 2, wherein the substrate is selected from a group consisting of: a sheet of Al—Mg alloy foil, a stainless steel sheet, and a polymer plate.

6. The light emitting diode device as claimed in claim 2, wherein the material of the rear metal layer is selected from a group consisting of: silver, copper, molybdenum, aluminum, copper aluminum alloy, silver copper alloy, and copper molybdenum alloy.

7. The light emitting diode device as claimed in claim 2, wherein material of the P-type semiconductor layer is selected from a group consisting of: P-type amorphous silicon, AlGaN, and AlGaAs.

8. The light emitting diode device as claimed in claim 2, wherein material of the P-N junction layer is selected from a group consisting of: CuIn1-XGaSe2(CIGS), CdTe and CuInSe2.

9. The light emitting diode device as claimed in claim 2, wherein material of the N-type semiconductor layer is selected from a group consisting of: N-type amorphous silicon, GaN, and InGaP.

10. The light emitting diode device as claimed in claim 2, wherein material of the transparent conductive layer is selected from a group consisting of: Indium Tin Oxide, and ZnO.

11. The light emitting diode device as claimed in claim 1, wherein a duty cycle of the second output signal of the PWM controller is predetermined to control the ratio of a turn-on time and a turn-off time of the illumination element.

* * * * *